United States Patent
Valcore, Jr. et al.

(10) Patent No.: US 9,455,126 B2
(45) Date of Patent: Sep. 27, 2016

(54) ARRANGEMENT FOR PLASMA PROCESSING SYSTEM CONTROL BASED ON RF VOLTAGE

(71) Applicant: Lam Research Corporation, Fremont, CA (US)

(72) Inventors: John C. Valcore, Jr., Berkeley, CA (US); Henry S. Povolny, Newark, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/808,846

(22) Filed: Jul. 24, 2015

(65) Prior Publication Data

US 2015/0332894 A1 Nov. 19, 2015

Related U.S. Application Data

(63) Continuation of application No. 13/959,584, filed on Aug. 5, 2013, now Pat. No. 9,128,473, which is a continuation of application No. 12/962,524, filed on Dec. 7, 2010, now Pat. No. 8,501,631, which is a (Continued)

(51) Int. Cl.
*H01J 37/32* (2006.01)
*G05B 19/418* (2006.01)
*G05B 15/02* (2006.01)

(52) U.S. Cl.
CPC ......... *H01J 37/32137* (2013.01); *G05B 15/02* (2013.01); *G05B 19/418* (2013.01);

(Continued)

(58) Field of Classification Search
CPC ............... H01J 37/32137; H01J 37/32917; H01J 37/32082; H01L 21/3065; H01L 21/76826; H01L 21/02274
See application file for complete search history.

(56) References Cited

U.S. PATENT DOCUMENTS 4,353,777 A 10/1982 Jacob
4,377,961 A 3/1983 Bode
(Continued)

FOREIGN PATENT DOCUMENTS

CN 101110347 A 1/2008
JP 2001-127045 A 5/2001
(Continued)

OTHER PUBLICATIONS

Christoph Steuer, TOOL Comparison at GC Stack Etch in LAM TCP Using Plasma Parameters (SEERS), Dec. 12, 2000, 2nd workshop on self excited electron plasma resonance spectroscopy, Dresden, Germany.

(Continued)

*Primary Examiner* — Mohsen Ahmadi
(74) *Attorney, Agent, or Firm* — Martine Penilla Group, LLP

(57) ABSTRACT

An arrangement for controlling a plasma processing system is provided. The arrangement includes an RF sensing mechanism for obtaining an RF voltage signal. The arrangement also includes a voltage probe coupled to the RF sensing mechanism to facilitate acquisition of the signal while reducing perturbation of RF power driving a plasma in the plasma processing system. The arrangement further includes a signal processing arrangement configured for receiving the signal, split the voltage signals into a plurality of channels, convert the signals into a plurality of direct current (DC) signals, convert the DC signals into digital signals and process the digital signal in a digital domain to generate a transfer function output. The arrangement moreover includes an ESC power supply subsystem configured to receive the transfer function output as a feedback signal to control the plasma processing system.

12 Claims, 13 Drawing Sheets

Related U.S. Application Data continuation-in-part of application No. 12/950,710, filed on Nov. 19, 2010, now Pat. No. 8,909,365.

(60) Provisional application No. 61/303,628, filed on Feb. 11, 2010, provisional application No. 61/262,886, filed on Nov. 19, 2009.

(52) U.S. Cl.
CPC ...... *H01J37/32082* (2013.01); *H01J 37/3299* (2013.01); *H01J 37/32174* (2013.01); *H01J 37/32917* (2013.01); *H01J 37/32926* (2013.01); *G05B 2219/45031* (2013.01)

(56) References Cited

U.S. PATENT DOCUMENTS

| | | |
|---|---|---|
| 4,420,790 A | 12/1983 | Golke et al. |
| 4,454,001 A | 6/1984 | Stemheim et al. |
| 4,457,820 A | 7/1984 | Bergeron et al. |
| 4,500,563 A | 2/1985 | Ellenberger et al. |
| 4,504,799 A | 3/1985 | Elmis et al. |
| 4,855,897 A | 8/1989 | Shinskey |
| 5,053,725 A | 10/1991 | Gesche et al. |
| 5,474,648 A | 12/1995 | Patrick et al. |
| 5,479,340 A | 12/1995 | Fox et al. |
| 5,556,549 A | 9/1996 | Patrick et al. |
| 5,571,366 A | 11/1996 | Ishii et al. |
| 5,689,215 A | 11/1997 | Richardson et al. |
| 5,694,207 A | 12/1997 | Hung et al. |
| 5,737,177 A | 4/1998 | Mett et al. |
| 5,764,471 A | 6/1998 | Burkhart |
| 5,788,801 A | 8/1998 | Barbee et al. |
| 5,810,963 A | 9/1998 | Tomioka |
| 5,812,361 A | 9/1998 | Jones et al. |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven et al. |
| 5,980,767 A | 11/1999 | Koshimizu et al. |
| 5,989,999 A | 11/1999 | Levine et al. |
| 6,020,794 A | 2/2000 | Wilbur |
| 6,021,672 A | 2/2000 | Lee |
| 6,042,686 A | 3/2000 | Dible et al. |
| 6,048,435 A | 4/2000 | DeOrnellas et al. |
| 6,110,214 A | 8/2000 | Klimasauskas |
| 6,157,867 A | 12/2000 | Hwang et al. |
| 6,198,616 B1 | 3/2001 | Dahimene et al. |
| 6,246,972 B1 | 6/2001 | Klimasauskas |
| 6,351,683 B1 * | 2/2002 | Johnson ............ H01J 37/32082 156/345.28 |
| 6,431,112 B1 | 8/2002 | Sill et al. |
| 6,441,555 B1 | 8/2002 | Howald et al. |
| 6,472,822 B1 | 10/2002 | Chen et al. |
| 6,522,121 B2 | 2/2003 | Coumou |
| 6,535,785 B2 | 3/2003 | Johnson et al. |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,781,317 B1 | 8/2004 | Goodman |
| 6,823,815 B2 | 11/2004 | Han et al. |
| 6,838,635 B2 | 1/2005 | Hoffman et al. |
| 6,862,557 B2 | 3/2005 | Jones et al. |
| 6,873,114 B2 | 3/2005 | Avoyan et al. |
| 6,972,524 B1 * | 12/2005 | Marakhtanov .... H01J 37/32091 118/723 MR |
| 6,983,215 B2 | 1/2006 | Coumou et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,323,116 B2 | 1/2008 | Guiney et al. |
| 7,359,177 B2 | 4/2008 | Yang et al. |
| 7,361,287 B2 | 4/2008 | Laermer |
| 7,375,038 B2 | 5/2008 | Kumar |
| 7,435,926 B2 | 10/2008 | Jafarian-Tehrani |
| 7,459,100 B2 | 12/2008 | Kiermasz et al. |
| 7,480,571 B2 | 1/2009 | Howald et al. |
| 7,505,879 B2 | 3/2009 | Tomoyasu et al. |
| 7,586,100 B2 | 9/2009 | Raj et al. |
| 7,728,602 B2 | 6/2010 | Valcore et al. |
| 7,764,140 B2 | 7/2010 | Nagarkatti et al. |
| 7,768,269 B2 | 8/2010 | Pipitone et al. |
| 7,858,898 B2 | 12/2010 | Bailey, III et al. |
| 7,967,944 B2 | 6/2011 | Shannon et al. |
| 8,040,068 B2 | 10/2011 | Coumou et al. |
| 8,053,991 B2 | 11/2011 | Kim et al. |
| 8,080,168 B2 | 12/2011 | Cirigliano |
| 8,080,760 B2 | 12/2011 | Dhindsa et al. |
| 8,103,492 B2 | 1/2012 | Brcka |
| 8,264,238 B1 | 9/2012 | El-Chouelry |
| 8,271,121 B2 | 9/2012 | Venugopal et al. |
| 8,368,308 B2 | 2/2013 | Banna et al. |
| 8,404,598 B2 | 3/2013 | Liao et al. |
| 8,501,631 B2 | 8/2013 | Valcore et al. |
| 8,679,358 B2 | 3/2014 | Nakagawa |
| 8,901,935 B2 | 12/2014 | Valcore et al. |
| 8,906,196 B2 * | 12/2014 | Nishio ....................... C23F 4/00 156/345.28 |
| 2002/0096257 A1 * | 7/2002 | Wang .................... C23C 16/507 156/345.48 |
| 2003/0082835 A1 | 5/2003 | McChesney et al. |
| 2003/0103793 A1 | 6/2003 | Murakoshi et al. |
| 2003/0119308 A1 | 6/2003 | Geefay et al. |
| 2004/0028837 A1 | 2/2004 | Fink |
| 2004/0045506 A1 | 3/2004 | Chen et al. |
| 2004/0060660 A1 | 4/2004 | Klimecky et al. |
| 2004/0061448 A1 | 4/2004 | Avoyan et al. |
| 2004/0087047 A1 | 5/2004 | Jaiswal et al. |
| 2004/0107906 A1 | 6/2004 | Collins et al. |
| 2004/0135590 A1 | 7/2004 | Quon |
| 2004/0222184 A1 | 11/2004 | Hayami et al. |
| 2004/0226657 A1 | 11/2004 | Hoffman |
| 2005/0039682 A1 | 2/2005 | Dhindsa et al. |
| 2005/0057165 A1 | 3/2005 | Goodman |
| 2005/0090118 A1 | 4/2005 | Shannon et al. |
| 2005/0133163 A1 | 6/2005 | Shannon et al. |
| 2005/0134186 A1 | 6/2005 | Brouk et al. |
| 2005/0151479 A1 | 7/2005 | Avoyan et al. |
| 2005/0205208 A1 * | 9/2005 | Sagae ............... H01J 37/32935 156/345.28 |
| 2005/0205532 A1 | 9/2005 | Patrick et al. |
| 2005/0217797 A1 | 10/2005 | Jafarian-Tehrani |
| 2005/0241762 A1 | 11/2005 | Paterson et al. |
| 2005/0252884 A1 | 11/2005 | Lam et al. |
| 2005/0264218 A1 | 12/2005 | Dhindsa et al. |
| 2006/0005928 A1 | 1/2006 | Howald et al. |
| 2006/0054596 A1 | 3/2006 | Howard |
| 2006/0065623 A1 | 3/2006 | Guiney et al. |
| 2006/0065631 A1 | 3/2006 | Cheng et al. |
| 2006/0065632 A1 | 3/2006 | Cheng et al. |
| 2006/0066248 A1 * | 3/2006 | Chistyakov ....... H01J 37/32082 315/111.21 |
| 2006/0081564 A1 * | 4/2006 | Moroz ............. H01J 37/32174 219/121.43 |
| 2006/0088655 A1 | 4/2006 | Collins et al. |
| 2006/0100824 A1 | 5/2006 | Moriya |
| 2006/0169582 A1 | 8/2006 | Brown et al. |
| 2006/0231526 A1 | 10/2006 | Donohue |
| 2006/0232471 A1 | 10/2006 | Coumou |
| 2007/0021935 A1 | 1/2007 | Larson et al. |
| 2007/0065594 A1 | 3/2007 | Chiang et al. |
| 2007/0095788 A1 | 5/2007 | Hoffman et al. |
| 2007/0127188 A1 | 6/2007 | Yang et al. |
| 2007/0247074 A1 | 10/2007 | Paterson et al. |
| 2007/0252580 A1 | 11/2007 | Dine et al. |
| 2007/0262723 A1 | 11/2007 | Ikenouchi |
| 2008/0029385 A1 | 2/2008 | Koshimizu et al. |
| 2008/0050537 A1 * | 2/2008 | Godyak ................. H01J 37/321 427/575 |
| 2008/0074255 A1 | 3/2008 | Park et al. |
| 2008/0237031 A1 * | 10/2008 | Sato ................... H01J 37/32082 204/164 |
| 2008/0241016 A1 | 10/2008 | Kato et al. |
| 2009/0105980 A1 * | 4/2009 | Tetsuka ............ H01J 37/32082 |

(56) References Cited

U.S. PATENT DOCUMENTS

| | | | |
|---|---|---|---|
| | | | 702/76 |
| 2009/0151871 A1 | 6/2009 | Pease et al. | |
| 2009/0210181 A1 | 8/2009 | Swank | |
| 2009/0255800 A1 | 10/2009 | Koshimizu | |
| 2009/0284156 A1 | 11/2009 | Banna et al. | |
| 2009/0294061 A1 | 12/2009 | Shannon et al. | |
| 2009/0295296 A1 | 12/2009 | Shannon et al. | |
| 2009/0308734 A1 | 12/2009 | Krauss | |
| 2010/0039747 A1 | 2/2010 | Sansoni et al. | |
| 2010/0099266 A1 | 4/2010 | Oswald et al. | |
| 2010/0136793 A1 | 6/2010 | Chen et al. | |
| 2010/0248488 A1 | 9/2010 | Agarwal et al. | |
| 2010/0258246 A1 | 10/2010 | Iwakoshi et al. | |
| 2010/0270141 A1 | 10/2010 | Carter et al. | |
| 2010/0314048 A1* | 12/2010 | Long | H01J 37/321 156/345.48 |
| 2010/0332201 A1 | 12/2010 | Albarede et al. | |
| 2011/0031216 A1 | 2/2011 | Liao et al. | |
| 2011/0097901 A1 | 4/2011 | Banna et al. | |
| 2011/0115492 A1 | 5/2011 | Valcore, Jr. et al. | |
| 2011/0118863 A1 | 5/2011 | Valcore, Jr. | |
| 2011/0137446 A1 | 6/2011 | Valcore, Jr. et al. | |
| 2011/0139748 A1 | 6/2011 | Donnelly et al. | |
| 2012/0000887 A1 | 1/2012 | Eto et al. | |
| 2012/0052689 A1 | 3/2012 | Tokashiki | |
| 2012/0073754 A1 | 3/2012 | De la Llera et al. | |
| 2012/0160806 A1* | 6/2012 | Godyak | H01J 37/321 216/61 |
| 2012/0187844 A1 | 7/2012 | Hoffman et al. | |
| 2012/0227484 A1 | 9/2012 | Chen et al. | |
| 2012/0262064 A1 | 10/2012 | Nagarkatti et al. | |
| 2013/0122711 A1 | 5/2013 | Marakhtanov et al. | |
| 2013/0180951 A1 | 7/2013 | Indrakanti et al. | |
| 2014/0062303 A1 | 3/2014 | Hoffman et al. | |
| 2014/0066838 A1 | 3/2014 | Hancock | |
| 2014/0076713 A1 | 3/2014 | Valcore, Jr. et al. | |
| 2014/0305589 A1 | 10/2014 | Valcore, Jr. et al. | |
| 2015/0002018 A1 | 1/2015 | Lill et al. | |

FOREIGN PATENT DOCUMENTS

| | | |
|---|---|---|
| JP | 2002-063999 | 2/2002 |
| JP | 2003-282545 | 10/2003 |
| JP | 2004239211 A | 8/2004 |
| JP | 2004-335594 A | 11/2004 |
| JP | 2005130198 A | 5/2005 |
| JP | 2005284046 A | 10/2005 |
| JP | 2010504614 A | 2/2010 |
| KR | 10-2005-0088438 A | 9/2005 |
| KR | 10-2005-0089995 A | 9/2005 |
| WO | WO 9914699 A1 | 3/1999 |
| WO | WO 2008002938 A2 | 1/2008 |
| WO | WO 2008036210 A2 | 3/2008 |
| WO | WO 2012054306 A2 | 4/2012 |
| WO | WO 2014070838 A1 | 5/2014 |

OTHER PUBLICATIONS

Darnon et al., "Synchronous Pulsed Plasma for Silicon Etch Applications", ECS Transactions, 27 (1) pp. 717-723 (2010), Publication by: The Electrochemical Society.

Electromagnetic Waves and Antennas, Sophocles J. Orfanidis, Rutgers University, Aug. 25, 2013, Chapter 10.10.

Lars Christoph, Comparison of Applied Materials DPS Chambers used for poly-Si Etch process by Plasma Parameters, Dec. 6, 2000, 2nd workshop on self excited electron plasma resonance spectroscopy, Dresden, Germany.

PCT/IB2013/051010 International Search Report and Written Opinion, mailed Jul. 3, 2013 (13 pages).

PCT/US2010/057450 International Search Report and Written Opinion, mailed Jul. 18, 2011 (9 pages).

PCT/US2010/057478 International Search Report and Written Opinion, mailed Jul. 26, 2011 (6 pages).

PCT/US2011/063422 International Search Report and Written Opinion, mailed Mar. 28, 2012 (9 pages).

* cited by examiner

How are the 2 methods Different?

- Initial Method Utilizes MVA [multivariate analysis] to create a LINEAR Transfer Function
  - PLS (partial least squares) implemented for each state space to create linear transfer function [RF Voltage to Wafer Bias]
- Current Method Utilizes Non-Linear Transfer Function [power equation]
  - Power Equation used based on existing Physical Relationship of RF Power to RF Voltage
    - Voltage = sqrt( Power / R )
      - This can be rewritten to $V = a * (Power/|Z|)^b + c$
      - In Theory, $a = 1$, $b = .5$, and $c = 0$
- Impedance of the Plasma is a Function of RF Power Delivered *as well as* Process Parameter [Chemistry, Pressure, Flow, Chamber Coupling (Capacitive/Inductive)]
- First Order Approximation, $V\_wafer\_dc = V\_rf$
- For a given Frequency, Explicit Power Equation Can be Used to Relate RF Voltage to Wafer DC Voltage
  - $V\_wafer\_dc = a * V\_rf^b + c$
    - Coefficients a, b, c are optimized to cover entire operating range of Plasma impedance for a given Frequency

FIGURE 8

Further Details

- 7 state spaces exist
  - For single frequency, single equation exists ($V\_wafer\_dc = a * Vpp \wedge b + c$)
    - Coefficient {a} is bounded by [.3 3]
    - Coefficient {b} is bounded by [.5 and 1] (can never be greater than one)
    - Coefficient {c} is typically 0, (more or less compensate for measurement inaccuracy)
  - For multi frequency state
    - Each Frequency's contribution is computed based upon Single Frequency Transfer Function
    - Individual Frequency's contributions are Summed together
    - Final Result, $V\_wafer\_dc = a * V\_summation \wedge b + c$
      - Coefficients {a, b, c} have same bounds

- WHY Does this work?
  - Revisiting $V = sqrt(Power / |Z|)$, and first order approximation $V\_wafer\_dc = V\_rf$
  - Coefficient {a} is a function of Plasma Impedance
  - Coefficient {b} is a function of RF Voltage Peak Detection Method
  - Coefficient {c} is a function of calibration

FIGURE 9

Further Details

- In theory, you could simply have one power equation

- $V\_wafer\_dc = a * (Sum(RF\_Pwr\_2MHz/|Z2MHz| + RF\_Pwr\_27MHz/|Z27Mhz| + RF\_Pwr\_60MHz/|Z60MHz|))^{\wedge} b + c$

- Coefficients (a,b,c) where optimized to account for accuracy/precision of Delivered Power and Plasma Impedance Measurements

ARRANGEMENT FOR PLASMA PROCESSING SYSTEM CONTROL BASED ON RF VOLTAGE

CLAIM OF PRIORITY

This application is a continuation of U.S. patent application Ser. No. 13/959,584, filed on Aug. 5, 2013, entitled, "ARRANGEMENT FOR PLASMA PROCESSING SYSTEM CONTROL BASED ON RF VOLTAGE," which is a continuation of U.S. patent application Ser. No. 12/962,524, filed on Dec. 7, 2010, entitled "PLASMA PROCESSING SYSTEM CONTROL BASED ON RF VOLTAGE" (since issued as U.S. Pat. No. 8,501,631 on Aug. 6, 2013), which is a continuation-in-part of an earlier filed U.S. patent application Ser. No. 12/950,710, filed on Nov. 19, 2010, entitled "METHODS AND APPARATUS FOR CONTROLLING A PLASMA PROCESSING SYSTEM" (since issued as U.S. Pat. No. 8,909,365 on Dec. 9, 2014), which claims priority under 35 USC. 119(e) to a commonly-owned U.S. Provisional Patent Application No. 61/303,628, filed on Feb. 11, 2010, entitled "BIAS COMPENSATION APPARATUS AND METHODS THEREFOR", and U.S. Provisional Patent Application No. 61/262,886, filed on Nov. 19, 2009, entitled "METHOD AND DEVICE FOR COMPENSATING WAFER BIAS IN A RF DRIVEN PLASMA CHAMBER", all of which are incorporated herein by reference.

BACKGROUND OF THE INVENTION

In the semiconductor industry, the use of RF driven plasma chambers for manufacturing silicon wafers is commonplace. There exists a common need within such applications to monitor the sheath voltage, and specifically how the sheath voltage relates to the DC bias potential of the wafer itself.

Currently, there are several techniques to ascertain wafer potential, as well as sheath and bulk plasma potential. With respect to the wafer DC bias potential, one monitoring method includes measuring the self-bias voltage of the wafer by detecting the leakage current between the wafer and the electrostatic chuck (ESC) while varying an applied DC voltage to the ESC. While this technique is used within some current production settings, the computed value is highly dependent upon the magnitude of the leakage current, which is coupled to the type of ESC in the system. The method of detecting leakage current through the wafer to the ESC is also highly dependent upon different types of backside wafer films.

Another method for ascertaining the wafer bias potential is through the use of silicon carbide pins attached to the outer edge of the ESC and in contact with the plasma. However, such pins are consumables and have to be replaced frequently within production environments.

A third method for detecting the DC bias on the wafer is through a RF voltage probe at the ESC and a signal processing unit which computes the wafer voltage from the peak to peak RF voltage. This method provides a means for detecting the wafer DC bias voltage without a probe in direct contact with the plasma by scaling the RF voltage at the ESC to a DC value through the use of a calibrated gain and offset. This method assumes a purely linear relationship to the RF peak to peak voltage and the DC potential of the wafer which is not the case for multi-frequency plasmas. FIG. 1 shows the correlation of wafer bias to RF Vpp. In FIG. 1, when a linear fit is applied, the R-squared value is significantly less than one [e.g., R-sq: 0.90].

BRIEF DESCRIPTION OF THE DRAWINGS

The present invention is illustrated by way of example, and not by way of limitation, in the figures of the accompanying drawings and in which like reference numerals refer to similar elements and in which:

FIGS. 6-10 discuss the high impedance RF voltage probe for computing wafer potential based on frequency dependent RF voltage signals.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described herein below, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

Figure 1:
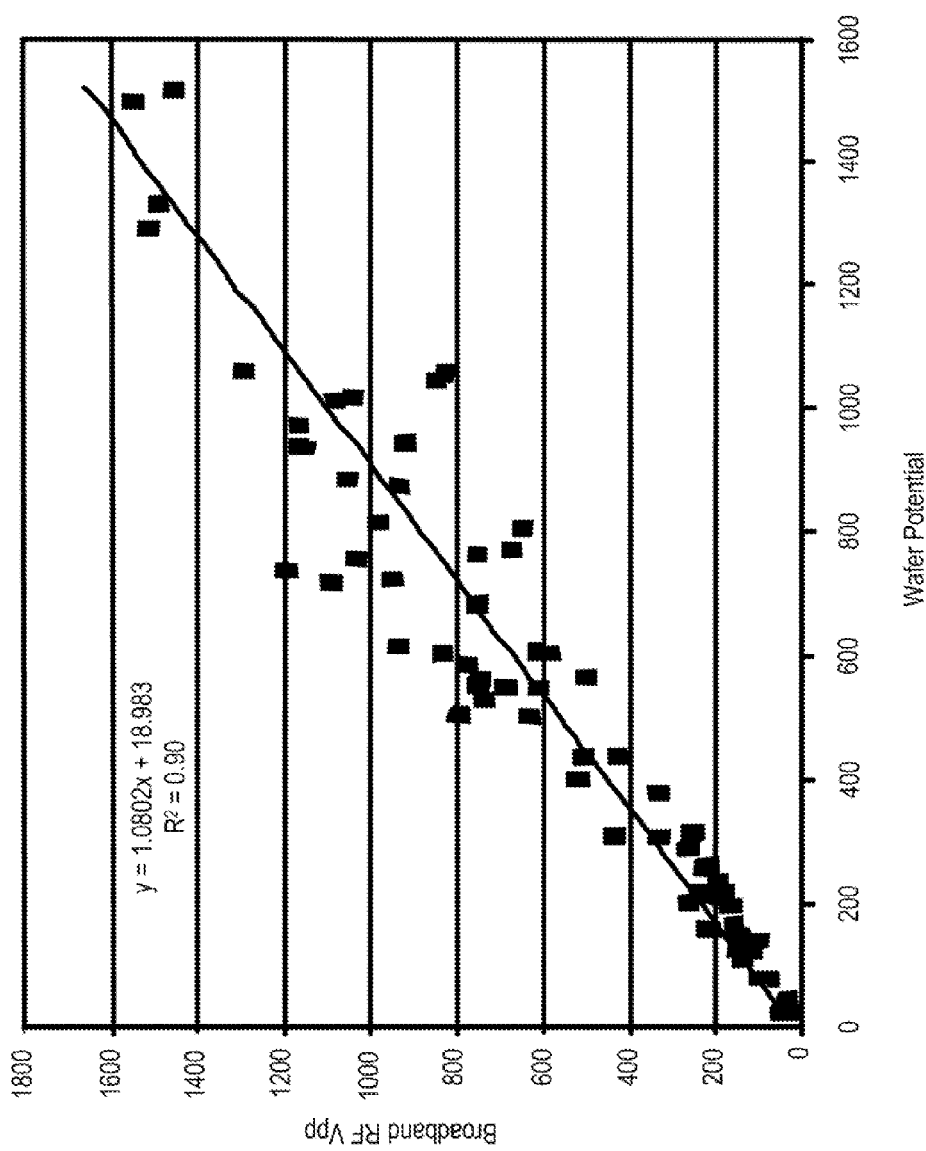
FIG. 1 shows the correlation of wafer bias to RF Vpp.
Figure 2:
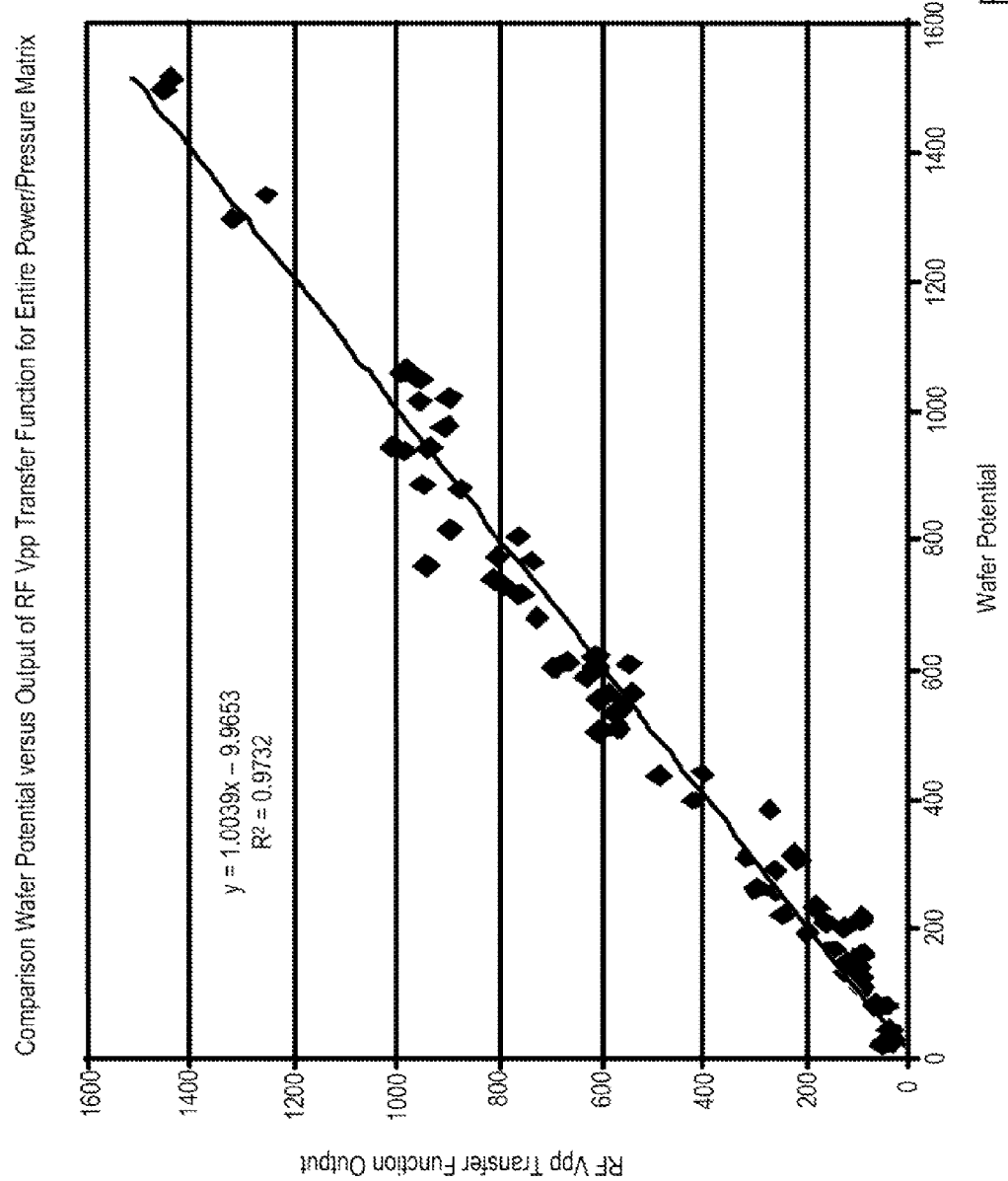
FIG. 2 shows the correlation of the wafer bias to the output of the disclosed RF voltage transfer function, with an R-squared value significantly closer to one.

Embodiments of the disclosed invention will provide the end user the ability to measure the wafer bias potential by appropriately filtering and conditioning the RF voltage at the ESC and utilizing a transfer function that accounts for contribution of multiple RF frequencies in biasing the wafer. FIG. 2 shows the correlation of the wafer bias to the output of the disclosed RF voltage transfer function, with an R-squared value significantly closer to one [e.g., R-sq: 0.97].

This invention was conceived while attempting to improve an existing method of measuring DC bias Potential with a silicon carbide pin. The wear rate of this pin as well as the quartz insulating material which housed the pin was found to be a limiting factor for production throughput. It has been determined that although a non-linear relationship existed between the RF voltage and wafer potential in a multi-frequency plasma, a transfer function could be used to derive wafer potential based upon the contribution of each individual frequency driving the plasma.

Figure 3:
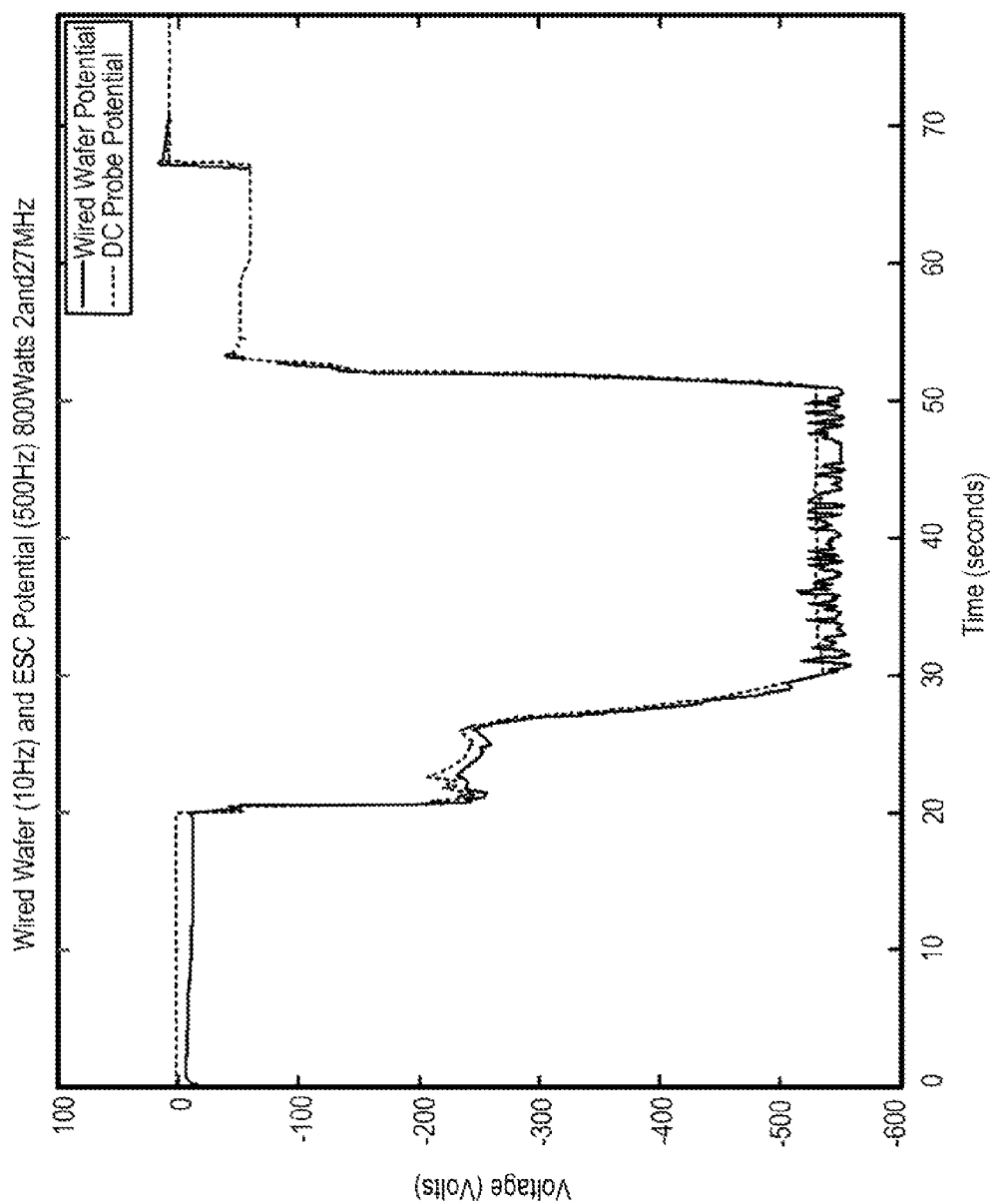
FIG. 3 depicts testing confirming the relationship between the plasma potential as seen by a Si carbide pin and the wafer potential as measured by a wired wafer.

Testing has been done to confirm the relationship between the plasma potential as seen by a Si carbide pin and the wafer potential as measured by a wired wafer, depicted in FIG. 3. It is then shown that the disclosed transfer function was significantly correlated to the voltage signal seen by the existing Si carbide pin.

Figure 4:
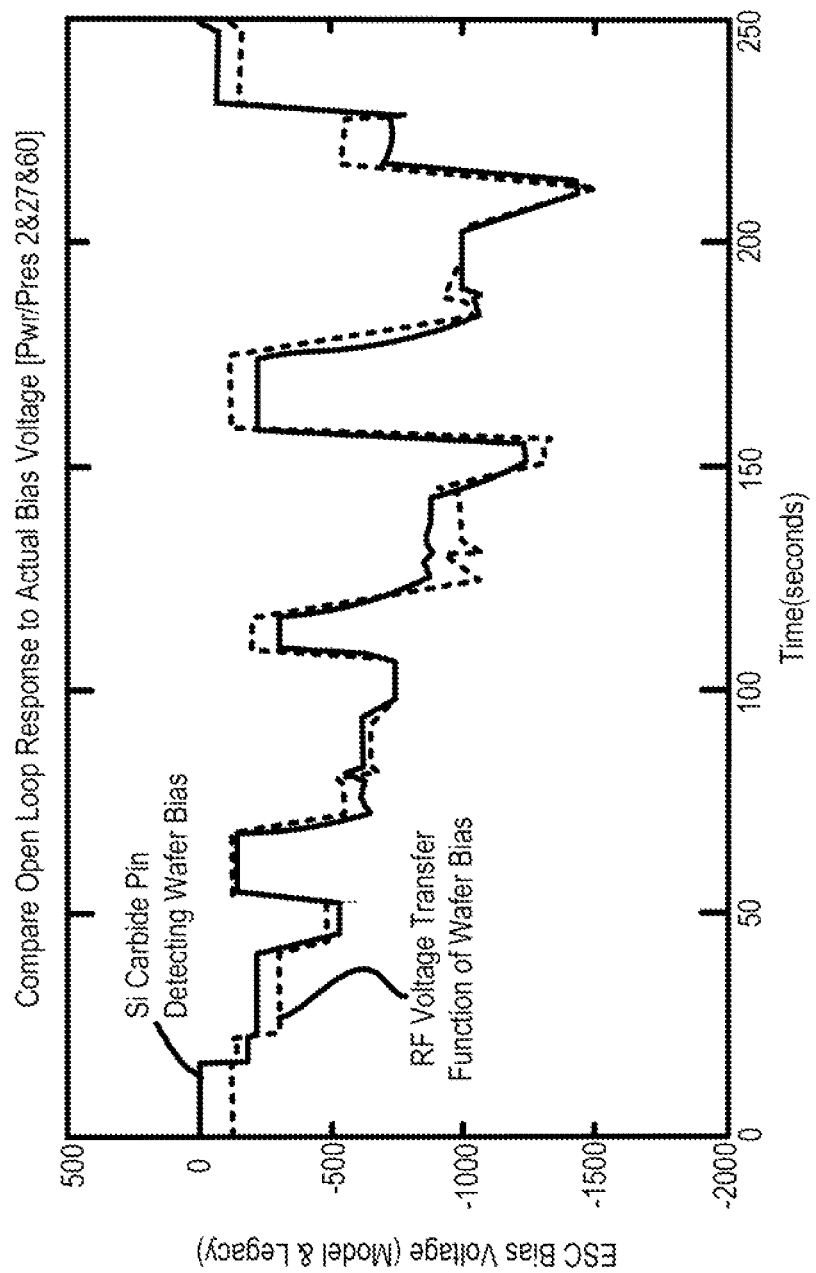
FIG. 4 shows the voltage seen by the Si HER (Hot Edge Ring) during a HARC (High Aspect Ratio Contact) process using 2 MHz, 27 MHz, and 60 MHz on a Lam DFC2300 Flex45 platform versus the voltage seen by Si carbide pin.

FIG. 4 shows the voltage seen by the Si HER (Hot Edge Ring) during a HARC (High Aspect Ratio Contact) process using 2 MHz, 27 MHz, and 60 MHz on a Lam DFC2300 Flex45 platform (available from Lam Research Corporation of Fremont, Calif.) versus the voltage seen by Si carbide pin. Given the aforementioned correlation of the Si carbide pin to the wired wafer, the commutative property provides credence to the statement that a transfer function involving individual RF voltages driving plasma is also a valid representation of the plasma sheath voltage at the wafer interface. In one or more embodiments, state-space analysis may be performed on the RF voltage to derive the transfer functions. State-space modeling is well-known and will not be elaborated here. In one or more embodiments, known transient handling techniques may be applied to improve robustness.

The features and advantages of embodiments of the invention may be better understood with reference to the figures and discussions that follow.

Figure 5A:
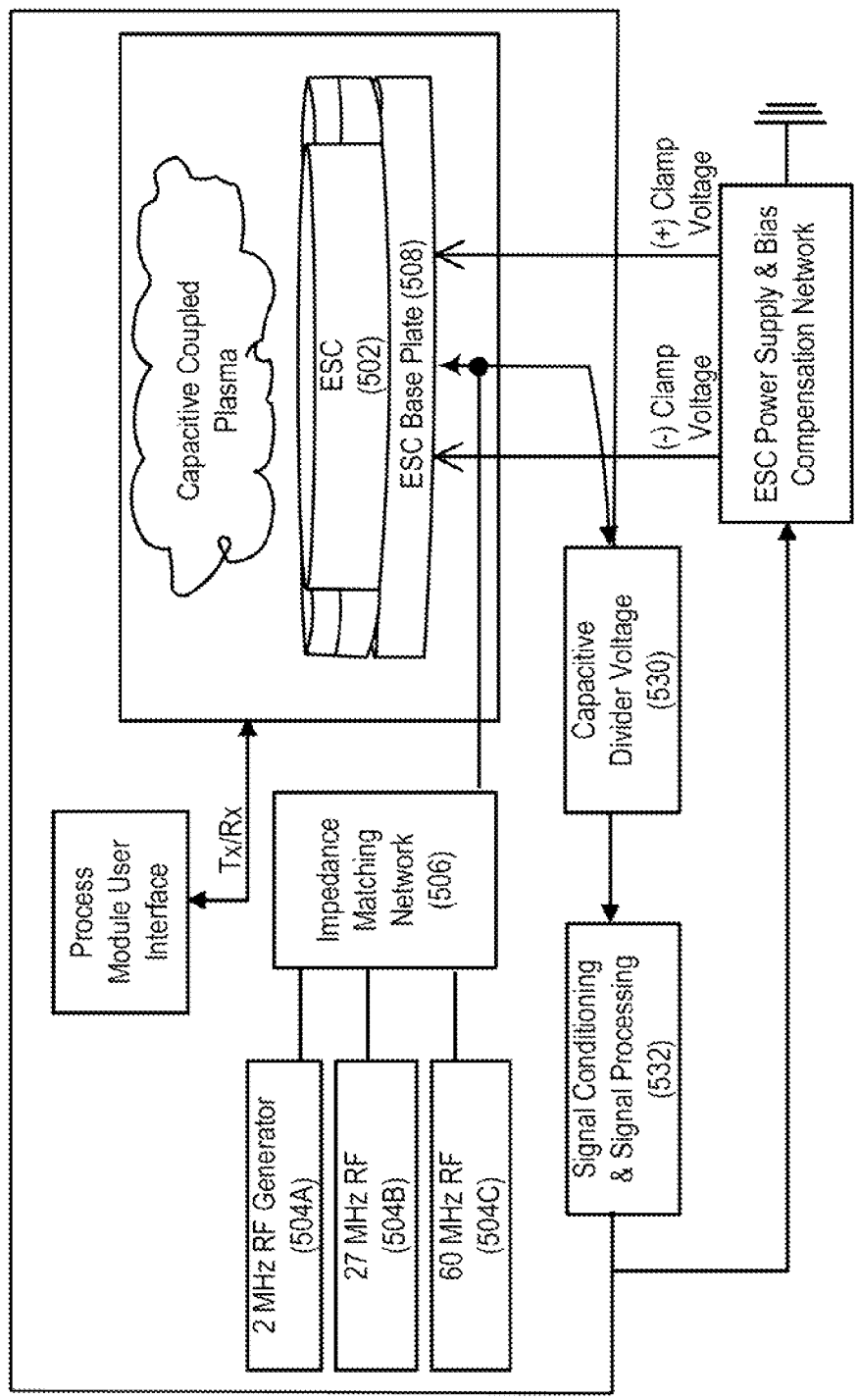
FIG. 5A depicts a system with a RF driven plasma that consists of an ESC power by three RF generators.

Generally speaking, the ability to indirectly measure the DC component of the plasma sheath potential within a RF driven plasma is dependent on a voltage probe connected to the RF rod in close proximity to the ESC. FIG. 5A depicts a system with a RF driven plasma that consists of an ESC 502 power by three RF generators 504A, 504B, and 504C via an impedance matching network 506. These RF generators provide different RF frequencies as shown although the number of frequencies employed, the exact frequencies employed as well as the number of RF generators employed may vary according to applications. An RF rod or another suitable RF sensing mechanism in close proximity (i.e., sufficiently close as to be able to sense the RF voltage) to base plate 508 (or another non-plasma exposing component associated with the ESC) provides a RF voltage to capacitive divider network 530. Capacity divider 530 will be discussed in greater details herein in connection with FIG. 5B. The output of capacitive divider network 530 is then provided to a signal conditioning and processing block 532, which will be discussed in greater details in connection with FIG. 5C herein below.

Figure 5B:
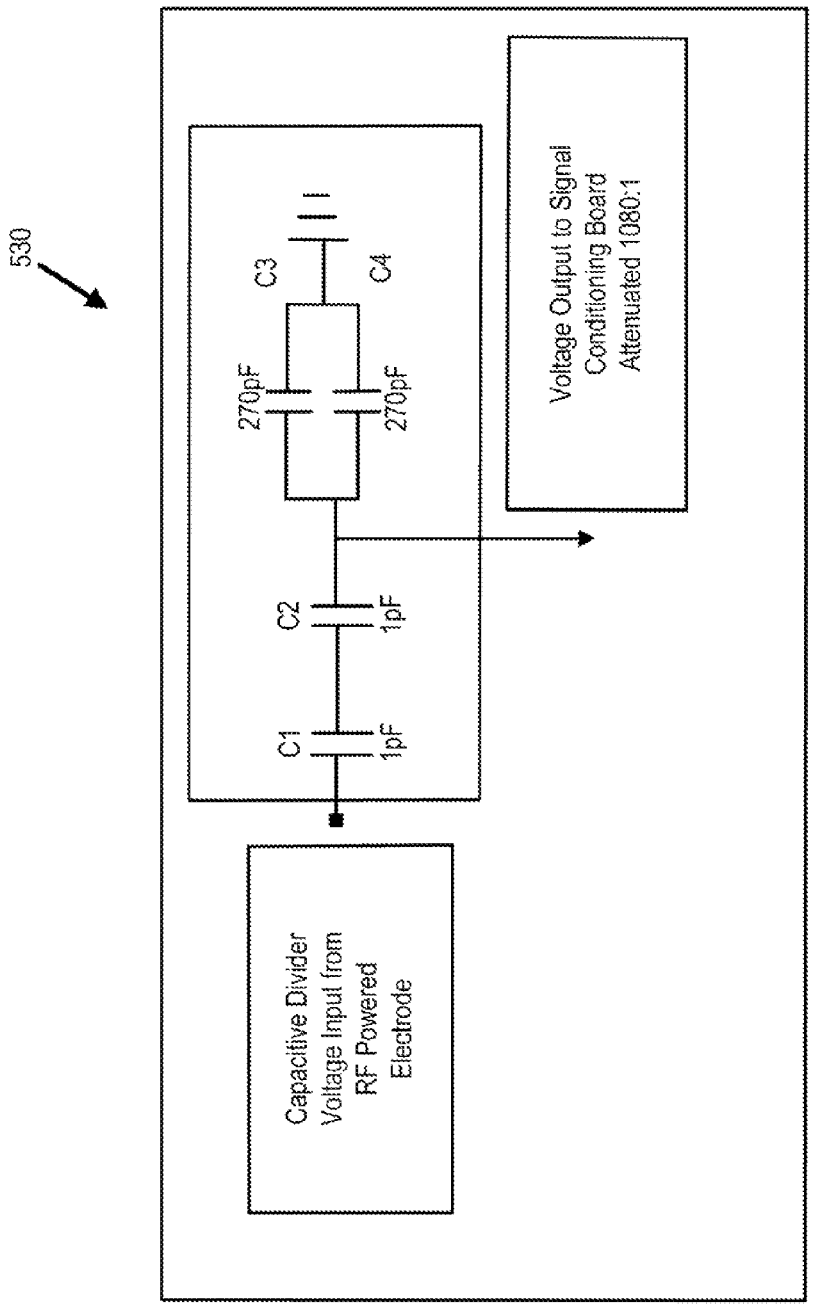
FIG. 5B illustrates an embodiment of the disclosed invention, where a voltage probe, consisting of a capacitive divider network, is attached to the RF rod in close proximity to the ESC base plate as well as a signal conditioning and signal processing apparatus.

FIG. 5B illustrates an example embodiment of the disclosed invention, where a voltage probe, including a capacitive divider network 530, is coupled to the RF rod (or another suitable RF sensing mechanism) in close proximity to the ESC base plate as well as coupled to a signal conditioning and signal processing apparatus. In the example of FIG. 5B, capacitor C1 is in series with capacitor C2, which is then in series with the parallel capacitors C3/C4. The voltage signal is obtained as shown in FIG. 5B. The capacitive divider voltage probe provides a high impedance path for the RF voltage to be sensed without unduly perturbing the RF power driving the plasma.

The specific make up of the capacitive divider is dependent upon the RF generators driving the plasma, with the highest frequency generator being the dominant factor. The capacitive divider also sufficiently attenuates the voltage signal by providing a low impedance path to ground in parallel with a 50-ohm coaxial cable responsible for carrying the voltage signal to the signal conditioning and signal processing apparatus. Note that these values are provided as example and for reference only and are not limiting. In the example of FIG. 5B the input impedance is significantly high [$Z=1/(\omega*C)$, when $\omega=60$ MHz, $C=0.5$ pF then $Z\sim33$ Kohms] and the impedance to ground is low (~31 ohms @ 60 Mhz).

Figure 5C:
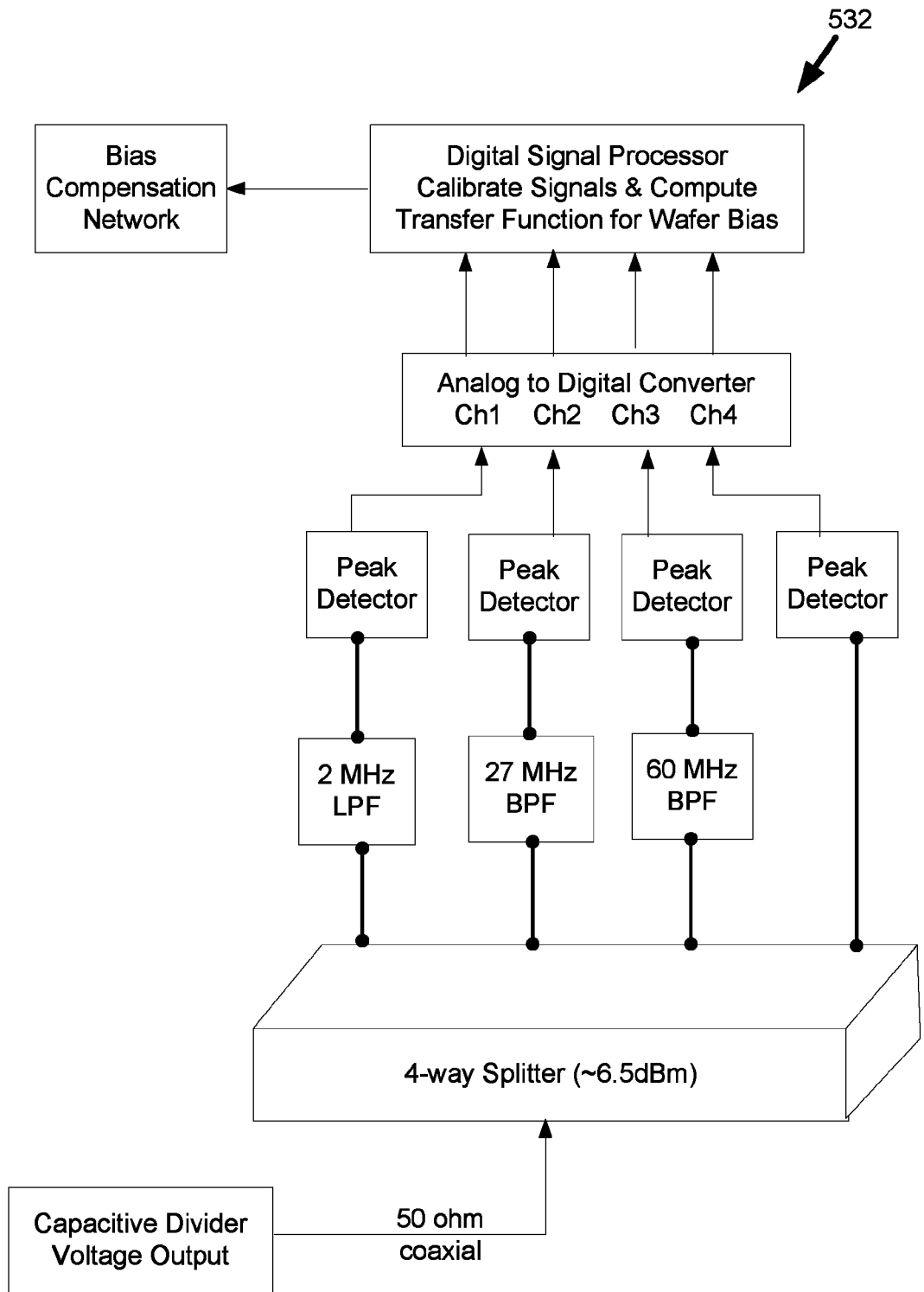
FIG. 5C is an embodiment of an analog RF voltage signal conditioning network with a digital signal processing unit.

The RF voltage signal is then conditioned through a network of analog or digital filters. FIG. 5C is an example embodiment of an analog RF voltage signal conditioning network of the type implemented in block 532 of FIG. 5A. At the input of the analog RF voltage signal conditioning network, the signal is split into a number of separate channels (4 in the example of FIG. 5C) to allow for RF filtering of specific RF frequencies responsible for driving the plasma. In this embodiment, the RF generator frequencies are 2 MHz, 27 MHz, and 60 MHz. One channel is not filtered, which maintains the broadband voltage frequency spectrum. In this embodiment the four channels are converted to a DC signal via a passive peak detector [e.g., 1N5711 diode], although an active peak detector could be used as well.

The DC signals are then converted to digital signals in order to be processed by the digital signal processor, where the individual signals are calibrated and inputted into the wafer bias transfer function. The output of the transfer function is then fed back to the bias compensation network. It should be noted that the disclosed analog signal conditioning network could be accomplished entirely within the digital domain. In this instance, there would be no need for a signal splitter or analog filters, simply an analog to digital converter (ADC) and a signal processing unit (DSP, FPGA, CPLD or the like), with the signal processing unit responsible for all filtering, peak detection, calibration, and transfer function computation.

In one or more embodiments, the calibration of each voltage channel is performed by applying a gain and offset to each channel. The gain and offset for each channel (2 MHz, 27 MHz, 60 MHz and broadband unfiltered voltages in the example of FIGS. 5A-5C) is determined by the signal response of a given channel and its correlation to the wafer bias. For the filtered channels, this is accomplished by characterizing a given filtered channel response to the wafer bias for that unique single frequency. For instance, the response of the 2 MHz channel would be correlated to the wafer bias for plasma being driven by 2 MHz only and the subsequent gain and offset would be used to calibrate this channel. This is repeated for 27 MHz and 60 MHz. The broadband signal is calibrated by correlating the wafer bias for plasma being driven by all three frequencies and each subsequent variation (2 MHz only, 2 MHz and 27 MHz, 60 MHz only, 27 MHz and 60 MHz, etc. . . . ).

An important factor into the calibration is also the response of the capacitive divider voltage probe 530. The capacitive divider tends to have a unique signal response for each frequency. As a suggested solution, a network analyzer can be used to characterize the response of the capacitive divider voltage sensor, and this response can then used to modify the aforementioned calibration coefficients accordingly. This is an important component in manufacturing accurate and repeatable instruments.

The transfer function for computing wafer bias in composed of four inputs: the calibrated DC voltage signals for 2 MHz, 27 MHz, and 60 MHz as well as the unfiltered broadband signal. The voltage signals are then multiplied by a set of coefficients. Each coefficient is a function of a given frequency mixture driving the plasma. The coefficients are derived through, for example, principal component analysis (PCA) of the matrix consisting of the wafer bias and the four voltage signals (2 MHz, 27 MHz, 60 MHz, and broadband). The individual resultants of the coefficient multiplication are then summed, producing a wafer bias value. Conditional statements and weighting factors can also be used to optimize the coefficients and thus optimize the transfer function result.

Figure 6:
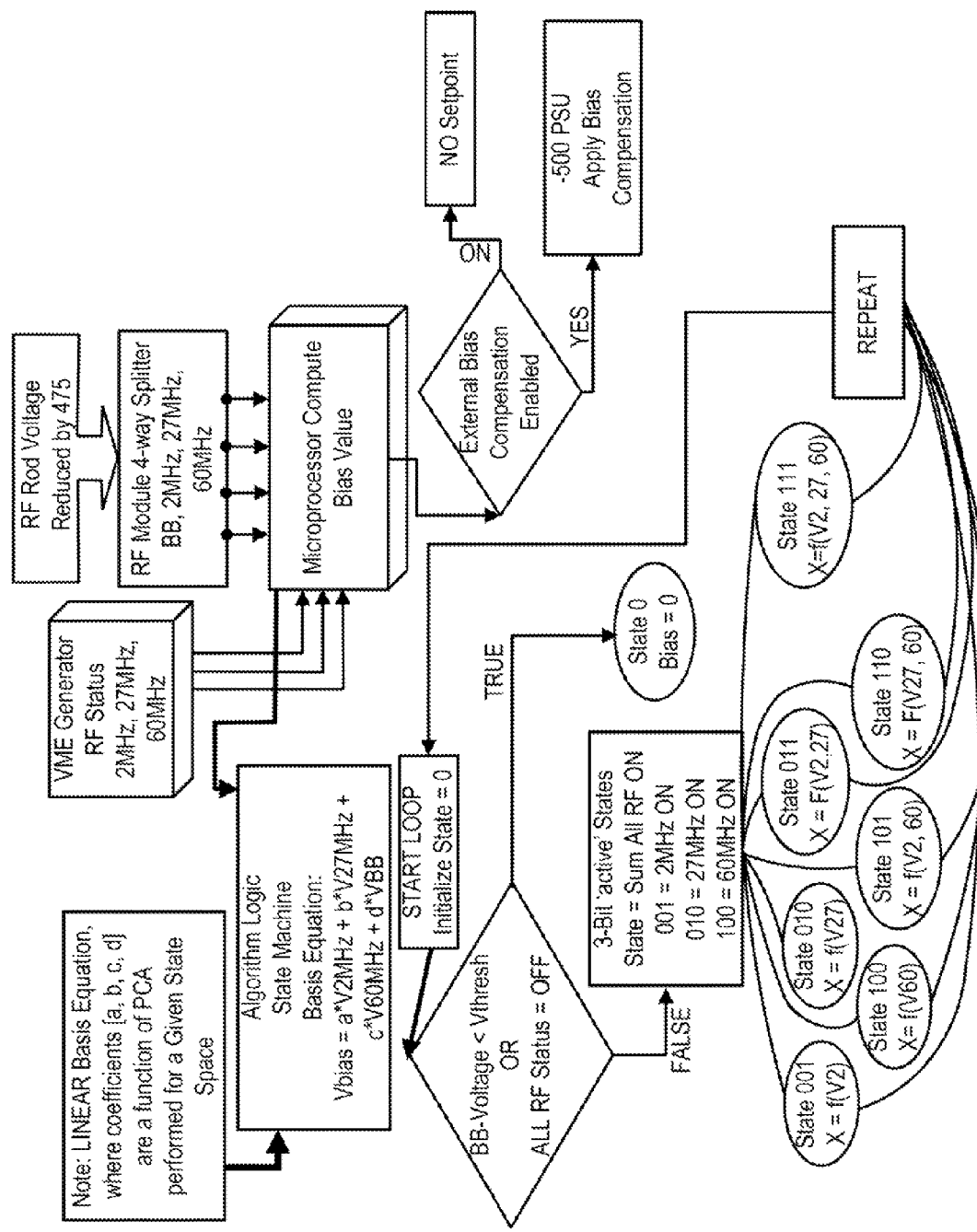
Figure 7:
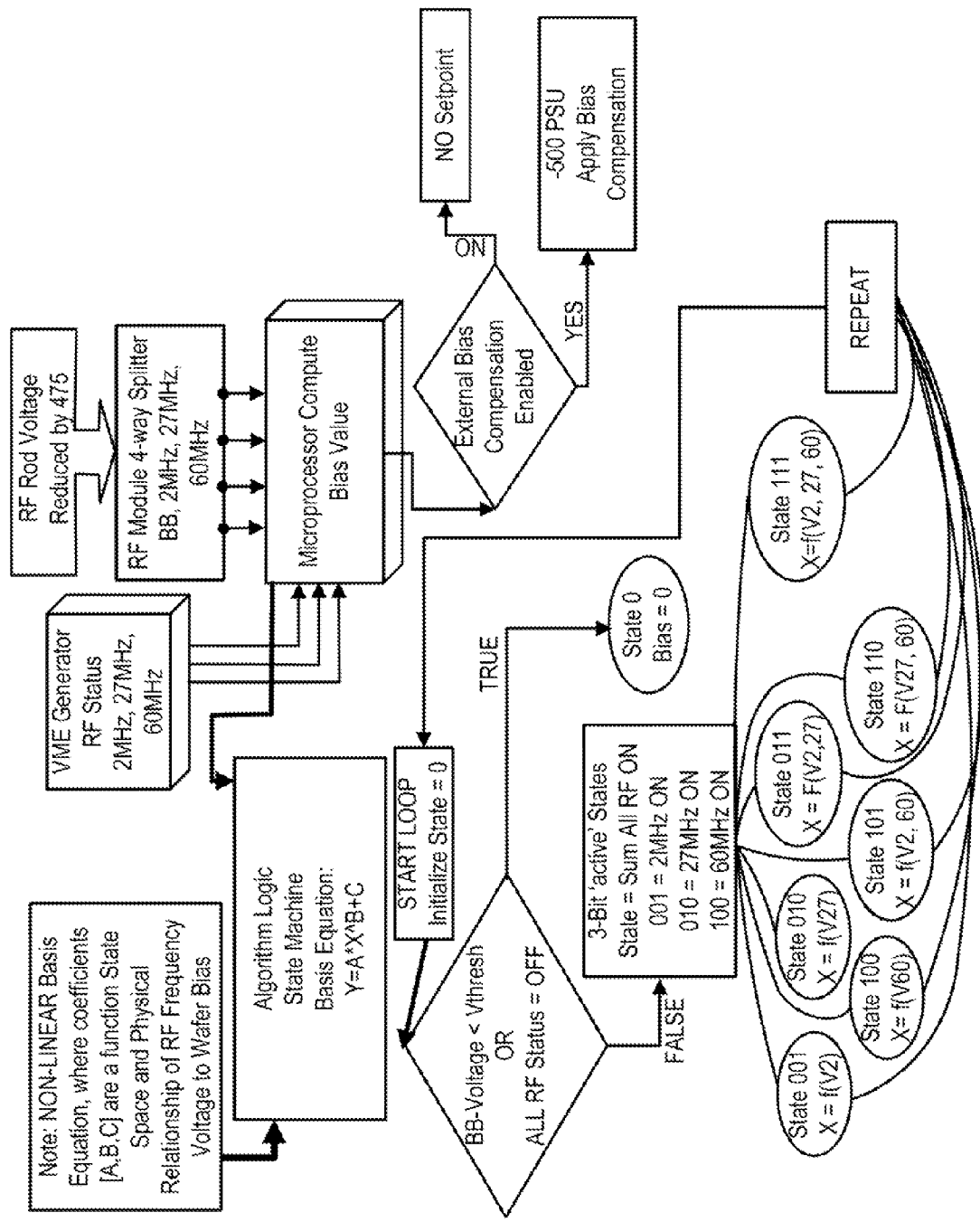

FIGS. 6-10 further discuss the high impedance RF voltage probe for computing wafer potential based on frequency dependent RF voltage signals. In FIG. 6, a linear transfer function is created and the example flowchart illustrates how this linear transfer function may be employed to produce the wafer bias value. FIG. 7 is a flowchart illustrating the use of a non-linear transfer function to produce the wafer bias value. Non-linear transfer functions are believed to be better able to approximate the wafer bias value from the RF voltage in some, if not most, situations. FIGS. 8, 9, and 10 are further explanation of the merits of each approach (linear vs. nonlinear). Both approaches provide a way, in accordance with embodiments of the invention, to correlate the sensed RF voltage to the wafer bias voltage, especially in multi-frequency applications. The wafer bias voltage may then used as a feedback or control signal for the ESC power supply and/or bias compensation network and/or other subsystems in the plasma processing system.

Figure 11:
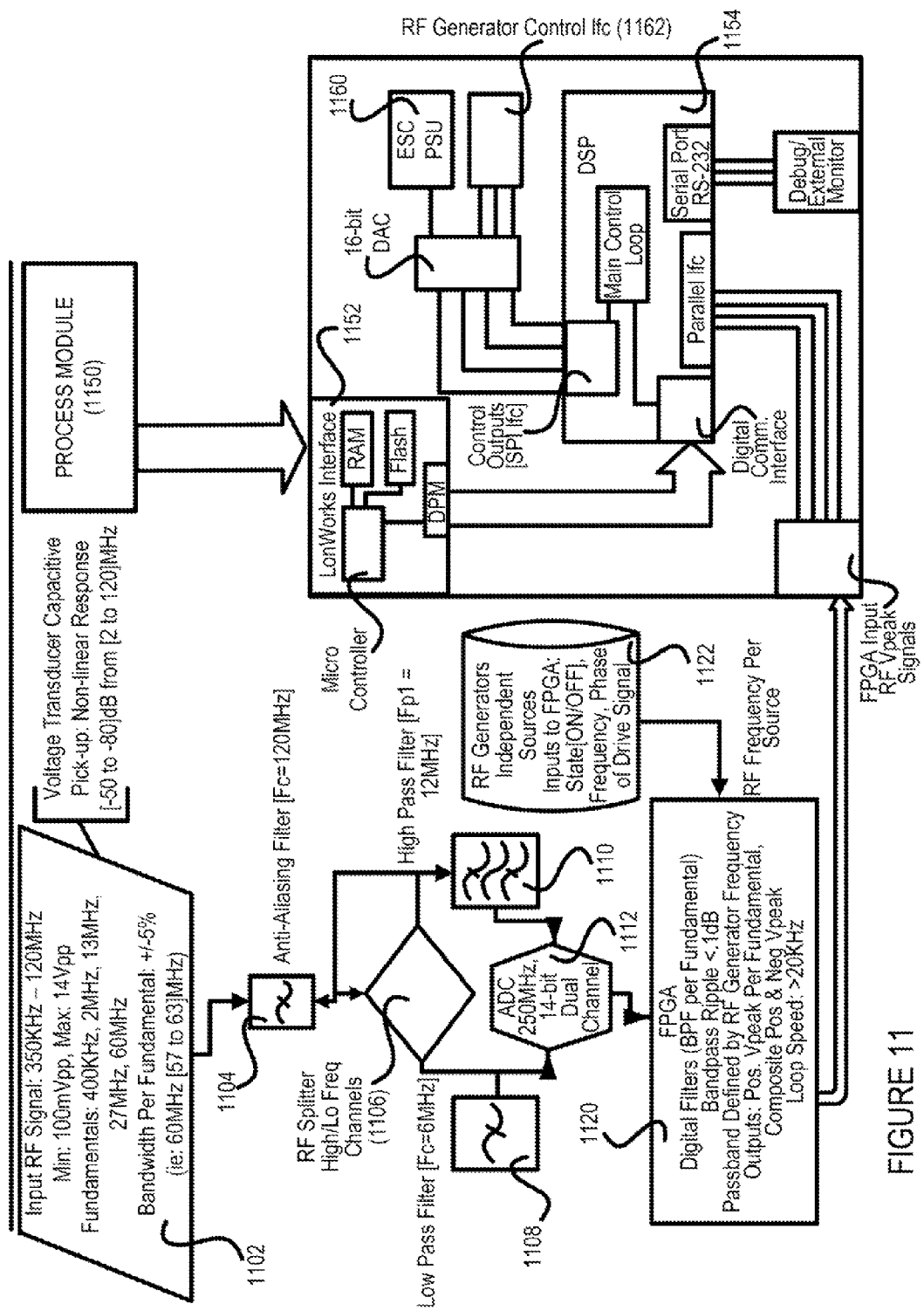
FIG. 11 shows, in accordance with an embodiment of the present invention, a block diagram of an example digital implementation embodiment.

In another embodiment, the ESC RF signal may be processed in the digital domain to improve configurability and to accommodate a wider RF power dynamic range required by demanding processing applications such as some high aspect ratio etches. FIG. 11 shows a block diagram of an example digital implementation embodiment. Input ESC RF signal in block 1102 may be obtained from a capacitive pickup, such as the capacitive divider network 530 of FIG. 5*a* for example. In the example of FIG. 11, the input RF signal ranges from about 350 KHz to 120 MHz, with fundamental frequencies at about 400 KHz, 2 MHz, 13 MHz, 27 MHz, and 60 MHz although these example values as well as the number of frequencies involved are not limiting of the scope of the invention.

The input RF signal is then filtered using an anti-aliasing low-pass filter 1104 with the filter frequency set at about ½ of the sampling rate of the analog-to-digital converter (ADC) that is employed later to convert the analog input RF signal from block 1102 to a digital signal. In the case of the example of FIG. 11, the ADC sampling rate is 250 MHz and thus the anti-aliasing filter is set at about 120 MHz, which is less than ½ of the ADC sampling rate (for satisfactory signal resolution in accordance with Nyquist's theorem).

The filtered RF signal from anti-aliasing filter 1104 is then split by RF splitter 1106 into two channels (using appropriate low pass and high pass filters) to feed into dual-channel ADC 1112. RF splitting is optional to improve signal resolution and is performed as an optimization to accommodate the use of a dual-channel ADC. However, it is possible to employ a single channel ADC and feed the filtered RF signal from anti-aliasing filter 1104 into the single channel ADC if desired.

Thus, in contrast to the analog approach of FIG. 5*c*, the analog input RF signal is not required to be split in the analog domain and/or peak-detected in the analog domain. Rather, the RF signal is converted (after appropriate filtering via an anti-aliasing filter) into the digital domain by ADC converter 1112. This improves both configurability and dynamic range response since the limitations of the analog peak detection scheme is not experienced. Specifically, the digital approach overcomes the limitation imposed by the non-linear response of the rectifying diode in the analog peak detection scheme. Another limiting factor of an analog peak detection scheme is that the diode output tends to be a function of the Input Voltage RMS, essentially a power detector. This characteristic further limits the ability of analog detectors to resolve the actual RF Peak Amplitude, rather than an averaged RF Voltage peak as function of the RMS signal. The digital approach sidesteps both of these and other issues.

Digital processing is performed by logic represented in FIG. 11 by a field programmable gate array (FPGA) 1120. FPGA is employed in the instant example partly to take advantage of the FPGA's parallel processing capability on multiple channels although other forms of logic, including microprocessors, microcontrollers, dedicated hardware circuitry, digital signal processors, etc., may also be employed.

One of the improvements relates to the use of RF signals from the RF generators (1122) as independent inputs into the digital processing block 1120. The independently inputted RF signal data, which may include state (on/off), fundamental frequency, and drive signal phase for each RF signal from the RF generators, may be used extract the fundamental tones to tune the digital filters (such as band pass filters) in block 1120. The phase data is particularly useful in resolving modulation effects among ESC RF signals of various frequencies to more accurately compute the voltage at any given frequency.

To elaborate, the phase signal allows for the demodulation of the RF signals that are a function of plasma dynamics (as an active non-linear load). It is common practice to view a plasma chamber as an RF mixer, generating tones as function of the frequency of the RF Source(s) as well as the rates of association/disassociation of gases and the expansion/contraction of the plasma sheaths. By utilizing the phase of the drive signal for each RF generator sourcing and/or biasing the plasma, one can more accurately resolve each fundamental RF tone, even in the most dynamic plasma conditions, such as pulsing of the RF generators.

Alternatively or additionally, the tuning of these digital filters using the fundamental tones extracted from the RF signals from the RF generators enable the construction of very precise and narrowly tailored filters around the fundamental frequencies, which greatly improve the accuracy of the signal resolution by the digital processing block 1120.

The outputs from digital processing block 1120 include the peak voltage (Vpeak) for each fundamental frequency and for the composite broadband signal. Peak detection can be positive peak, negative peak, or both. For the composite signal, negative peak information is particularly useful during the processing phase since there is often an asymmetry in the waveform as a function of the harmonics of each RF source. Therefore, by detecting both the positive and negative peaks, one can resolve a relative metric of the harmonics in the plasma. This harmonic metric can then be used to further optimize wafer bias potential transfer function for a given state space.

As discussed, an advantage of the digital approach is the ease of configurability. For example, when different RF frequencies and/or additional RF frequencies and/or fewer RF frequencies are employed, the hardware does not need to be changed. The digital filters, transfer functions, and other optimizations may be reprogrammed on the same programmable logic, saving a significant amount of time and cost when applications change.

Another aspect of the invention relates to the use of additional plasma chamber parameters to improve the correlation between the ESC RF voltage and the wafer bias potential. These additional chamber parameters include chamber pressure, chamber gap (distance between electrodes), RF delivered power, RF Frequency, RF generator impedance matching network tap positions (capacitor positions of variable LC network), chamber chemistry, chamber topology (i.e.: ground area ratio), wafer type (backside film, substrate film stack), and wafer resistivity. In the present discussion, two specific chamber parameters (pressure and gap distance) are discussed to facilitate understanding although the number and exact parameters may vary depending on applications.

In another aspect of the invention, the inventor herein notes that there is a noticeable change in correlation (e.g., gain in the slope of the trend line) between RF voltage and wafer bias voltage when different chamber pressures are involved. By taking chamber pressure into account, more accurate on-the-fly determination of wafer bias voltage may be obtained from the ESC RF voltage. The compensating function or equation or scaling factor may be determined empirically in a research setting (e.g., by mapping the RF voltage versus the wafer bias voltage at different chamber pressures and determine the correlation change) for later use in a production setting, for example. In an embodiment, the chamber pressure information may be employed as a scaling factor to scale the pressure-agnostic transfer function output. Additionally or alternatively, the chamber pressure may be employed as another input into the transfer function to obtain a pressure-specific output for a given input into the transfer function.

In another aspect of the invention, the inventor herein notes that there is a noticeable change in correlation (e.g., gain in the slope of the trend line) between ESC RF voltage and wafer bias voltage when different chamber gaps between the upper and lower electrodes are involved. By taking electrode gap data into account, more accurate on-the-fly determination of wafer bias voltage may be obtained from the ESC RF voltage. The compensating function or equation or scaling factor may be determined empirically in a research setting (e.g., by mapping the RF voltage versus the wafer bias voltage at different chamber gaps and determine the correlation change) for later use in a production setting, for example. In an embodiment, the chamber gap information may be employed as a scaling factor to scale the pressure-agnostic transfer function output. Additionally or alternatively, the chamber gap may be employed as another input into the transfer function to obtain a pressure-specific output for a given input into the transfer function. This optimization using chamber gap information may be employed alternatively or additionally in conjunction with the use of the chamber pressure information. Similar considerations apply to other chamber data if they are employed for further optimization of the transfer function.

Referring back to FIG. 11, the additional chamber data may be received from process module 1150 via an appropriate communication interface 1152. In the example of FIG. 11, the actual application of the transfer function and the optimization using the chamber data are performed in DSP block 1154 using the peak voltage (positive and negative) information received from block 1120 and the chamber data information received from block 1150. However, it is also possible to perform such transfer function application and optimization in block 1120, in which case block 1120 would obtain the chamber data directly from process module 1150 for example. The output of DSP block 1154 represents the computed wafer potential and is converted back to the analog domain via DAC 1156 to serve as a feedback or control signal to ESC power supply unit 1160 and/or RF generator 1162. For example, with the increased accuracy & precision of the computed wafer bias potential (computed as a function of the RF voltage as disclosed herein), one can use this computed value as a control signal for the RF generator delivered power in order to maintain a desired wafer potential for a given wafer process step.

Note that it is possible to perform analog splitting and peak detection (per FIG. 5c) and apply the additional optimization using additional chamber parameters in the manner discussed to obtain the computed wafer bias potential. Alternatively, the input RF signal may be converted directly into the digital domain as discussed in connection with FIG. 11 and then processed and optimized in the digital domain to obtain the computed wafer bias potential.

By processing the ESC RF signal in the digital domain and/or employing independently inputted RF generator signals and/or employing additional chamber parameters for correlation optimization, embodiments of the invention enable a more accurate computed wafer bias voltage to be obtained from the ESC RF voltage. The more accurately obtained wafer bias voltage in turn improves the ability to monitor the plasma health, to detect undesirable plasma conditions such as plasma unconfinement, etc.

While this invention has been described in terms of several preferred embodiments, there are alterations, permutations, and equivalents, which fall within the scope of this invention. For example, although the RF voltage employed to compute the wafer bias potential is disclosed herein to be one taken from the ESC or the ESC base plate or from another component of the ESC assembly or near the vicinity of the ESC, the RF voltage may in fact be measured at any point in the RF delivery path and employed for wafer bias calculation purposes. Accordingly, the term "RF voltage" and "ESC RF voltage" and "ESC RF signal" and the like should not be construed to be limiting by their terminology usage in the examples. It should also be noted that there are many alternative ways of implementing the methods and apparatuses of the present invention. Although various examples are provided herein, it is intended that these examples be illustrative and not limiting with respect to the invention.

What is claimed is:

1. An arrangement for controlling a plasma processing system that includes a plasma processing chamber, the arrangement comprising:
   a radio frequency (RF) sensing mechanism, said RF sensing mechanism is proximate to a non-plasma exposing component of an electrostatic chuck (ESC) disposed within the plasma processing system, to obtain an RF voltage signal;
   a voltage probe coupled to said RF sensing mechanism to facilitate acquisition of said RF voltage signal while reducing perturbation of RF power driving a plasma in said plasma processing system;

a signal processing arrangement including, an anti-aliasing filter to filter RF voltage signal received from the voltage probe;

a RF splitter to split the filtered RF voltage signal into a plurality of channels and to convert the RF voltage signal for each of the plurality of channels into a corresponding direct current (DC) signal;

an analog-to-digital converter (ADC) to convert the DC signal of each of the plurality of channels in a digital domain to a corresponding digital signal;

a digital processing block to process the digital signals within the digital domain, wherein the process includes, (a) maintaining one of the digital signals as an unfiltered broadband version of the digital signal;

(b) filtering the digital signals, wherein the filtering includes detecting a peak voltage of each frequency of the plurality of channels and peak voltage of a composite broadband signal;

(c) calibrating each of the plurality of digital signals;

(d) computing a transfer function using the digital signals as input to obtain a transfer function output, the transfer function output accounting for contribution of frequency of each of the plurality of channels of the RF voltage signal in wafer bias; and an ESC power supply subsystem configured to receive said transfer function output as a feedback signal to control said plasma processing system.

2. The arrangement of claim 1, wherein detecting peak voltage includes detecting one of a positive peak voltage, a negative peak voltage, or a combination of both the positive peak voltage and the negative peak voltage.

3. The arrangement of claim 1, wherein the ADC is a multi-channel ADC.

4. The arrangement of claim 1, wherein the non-plasma exposing component is a base plate.

5. The arrangement of claim 1, wherein the RF sensing mechanism is an RF rod.

6. The arrangement of claim 1, wherein the voltage probe is implemented at least by a capacitor divider network.

7. The arrangement of claim 1, wherein the transfer function represents a linear transfer function.

8. The arrangement of claim 1, wherein the transfer function represents a non-linear transfer function.

9. The arrangement of claim 1, wherein a filter frequency of the anti-aliasing low-pass filter is set to half of a sampling rate of the ADC.

10. The arrangement of claim 1 wherein said processing in the digital domain is performed by a field programmable gate array (FPGA).

11. The arrangement of claim 1, wherein computing the transfer function further includes using at least one plasma processing chamber parameter to generate the transfer function output that affects wafer bias.

12. The arrangement of claim 1, wherein the plasma processing chamber parameter includes at least one of chamber pressure, chamber gap defined by distance between electrodes, RF delivered power, RF frequency, RF generator impedance matching network tap positions having capacitor positions of variable inductance-capacitance (LC) network, chamber chemistry, chamber topology including a ground area ratio, wafer type, and wafer resistivity.

* * * * *